US008629025B2

(12) United States Patent
Chen et al.

(10) Patent No.: US 8,629,025 B2
(45) Date of Patent: Jan. 14, 2014

(54) SEMICONDUCTOR DEVICE AND METHOD FOR FABRICATING SEMICONDUCTOR DEVICE

(75) Inventors: Ko-Chi Chen, Taoyuan County (TW); Ping-Chia Shih, Tainan (TW); Chih-Ming Wang, Tainan (TW); Chi-Cheng Huang, Kaohsiung (TW); Hsiang-Chen Lee, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 63 days.

(21) Appl. No.: 13/403,591

(22) Filed: Feb. 23, 2012

(65) Prior Publication Data

US 2013/0221424 A1    Aug. 29, 2013

(51) Int. Cl.
*H01L 29/792* (2006.01)
*H01L 21/336* (2006.01)

(52) U.S. Cl.
USPC ............... 438/287; 257/324; 257/E29.309; 257/E21.423

(58) Field of Classification Search
USPC .......................................... 257/324
See application file for complete search history.

(56) References Cited

U.S. PATENT DOCUMENTS 7,288,452 B2    10/2007    Lee

*Primary Examiner* — Jarrett Stark
*Assistant Examiner* — Lawrence Tynes, Jr.
(74) *Attorney, Agent, or Firm* — J.C. Patents

(57) ABSTRACT

A method for fabricating a semiconductor device is described. A stacked gate dielectric is formed over a substrate, including a first dielectric layer, a second dielectric layer and a third dielectric layer from bottom to top. A conductive layer is formed on the stacked gate dielectric and then patterned to form a gate conductor. The exposed portion of the third and the second dielectric layers are removed with a selective wet cleaning step. S/D extension regions are formed in the substrate with the gate conductor as a mask. A first spacer is formed on the sidewall of the gate conductor and a portion of the first dielectric layer exposed by the first spacer is removed. S/D regions are formed in the substrate at both sides of the first spacer. A metal silicide layer is formed on the S/D regions.

11 Claims, 2 Drawing Sheets

US 8,629,025 B2

SEMICONDUCTOR DEVICE AND METHOD FOR FABRICATING SEMICONDUCTOR DEVICE

BACKGROUND OF THE INVENTION

1. Field of Invention

This invention relates to a semiconductor device, and a method for fabricating a semiconductor device.

2. Description of Related Art

Trapping-type memory devices, which include a charge-trapping layer instead of a floating gate between the substrate and the control gate, have been widely applied in the related fields.

In a conventional fabrication process of the trapping-type memory, the control gates are defined after the corresponding conductive layer is deposited over the charge-trapping layer, source/drain (S/D) regions are formed in the substrate after a spacer is formed on the sidewall of each control gate, and the trapping layer is not patterned between the step of defining the control gates and the step of forming the spacer.

Because the charge-trapping layer is not patterned before the spacer defining the bounds of the S/D regions is formed, metal silicide cannot be formed on the S/D regions. Hence, the sheet resistance of the S/D regions is high so that the device speed is lowered. Furthermore, the contact resistance of the S/D regions is high even open.

SUMMARY OF THE INVENTION

Accordingly, this invention provides a method for fabricating a semiconductor device, which can be utilized to solve the above issues in the prior art.

This invention also provides a semiconductor device that is fabricated by the method of this invention.

The method for fabricating a semiconductor device of this invention is described below. A stacked gate dielectric is formed over a substrate, including a first dielectric layer, a second dielectric layer and a third dielectric layer from bottom to top. A conductive layer is formed on the stacked gate dielectric. The conductive layer is patterned to form a gate conductor. The exposed portion of the third dielectric layer is removed with the gate conductor as a mask. The exposed portion of the second dielectric layer is removed with the gate conductor as a mask. S/D extension regions are formed in the substrate with the gate conductor as a mask. A first spacer is formed on the sidewall of the gate conductor and the portion of the first dielectric layer exposed by the first spacer is removed. S/D regions are formed in the substrate at both sides of the first spacer. A metal silicide layer is formed at least on the S/D regions.

In an embodiment, the above method further comprises, after the first spacer is formed but before the S/D regions are formed, forming a second spacer on the sidewall of the first spacer, wherein the S/D regions are formed in the substrate outside of the sidewall of the second spacer. In another embodiment, the S/D regions are formed in the substrate outside of the sidewall of the first spacer.

The semiconductor device of this invention includes a gate conductor on a substrate, a stacked gate dielectric between the gate conductor and the substrate, a first spacer on the sidewall of the gate conductor, S/D extension regions in the substrate outside of the sidewall of the gate conductor, S/D regions in the substrate outside of the sidewall of the first spacer, and a metal silicide layer at least on the S/D regions. The stacked gate dielectric includes, from bottom to top, a first dielectric layer, a second dielectric layer and a third dielectric layer, wherein the sidewall of the second dielectric layer is aligned with that of the gate conductor.

In an embodiment, the semiconductor device further includes a second spacer between the gate conductor and first spacer, wherein the sidewall of the first dielectric layer is aligned with that of the second spacer. In another embodiment, the sidewall of the first dielectric layer is aligned with that of the first spacer.

Because the portion of the second dielectric layer exposed by the gate conductor and the portion of the first dielectric layer exposed by the first spacer are removed in this invention, the metal salicide layer can be formed on the S/D regions to reduce the electrical resistance, especially when the method is applied to the fabrication of a non-volatile memory device with the second dielectric layer being a (SiN) charge-trapping layer and the first dielectric layer being a tunnel layer.

In order to make the aforementioned and other objects, features and advantages of the present invention comprehensible, a preferred embodiment accompanied with figures is described in detail below.

DESCRIPTION OF EMBODIMENTS

It is noted that the following embodiments are intended to further explain this invention but not to limit its scope. For example, though the first dielectric layer, the second dielectric layer and the third dielectric layer in the stacked gate dielectric are respectively a tunnel layer, a charge-trapping layer and a top insulator of a non-volatile memory cell, they can be films of a different device that have other functions.

Figure 1A:
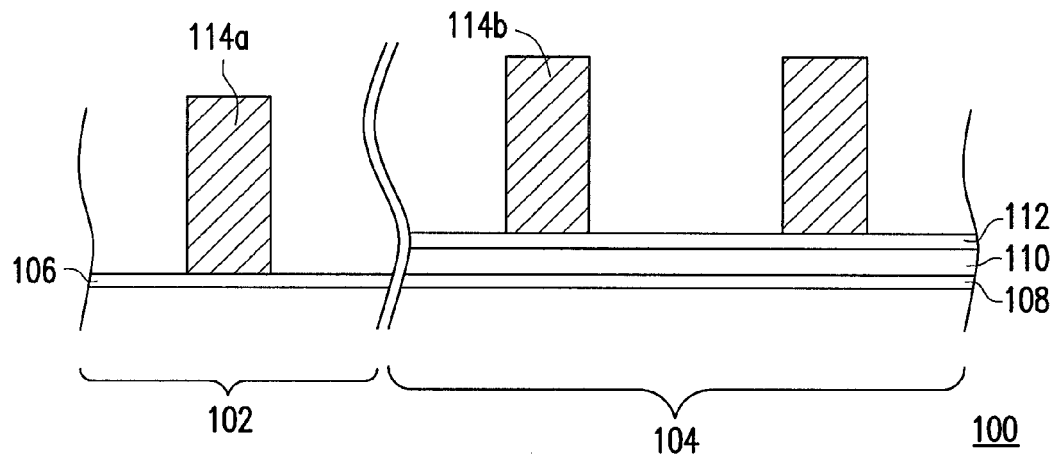
FIGS. 1A-1D illustrate, in a cross-sectional view, a method for fabricating a semiconductor device according to a first embodiment of this invention, wherein FIG. 1D also illustrates the semiconductor device according to the first embodiment.
Figure 1B:
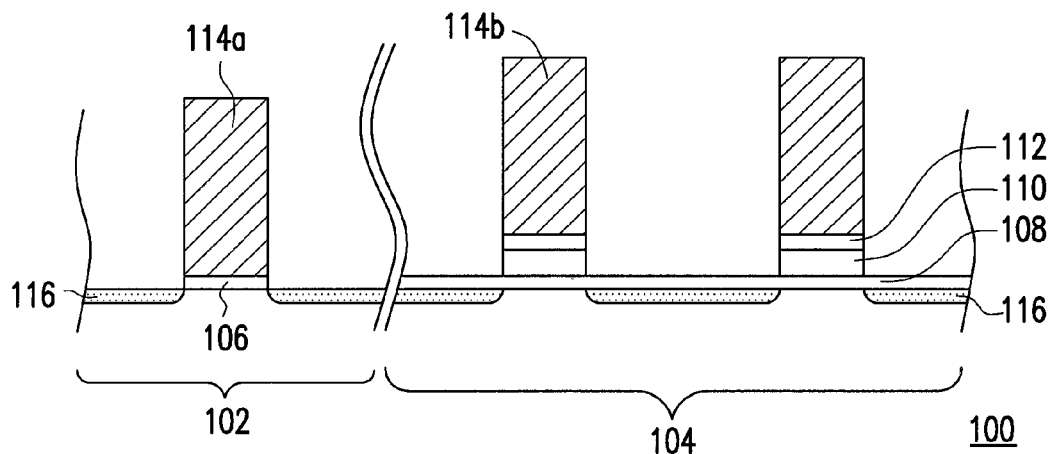
Figure 1C:
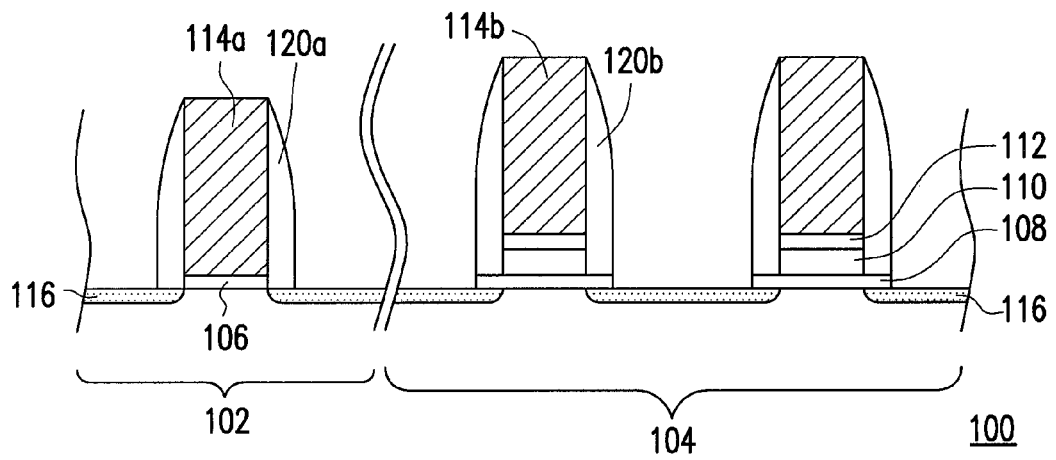
Figure 1D:
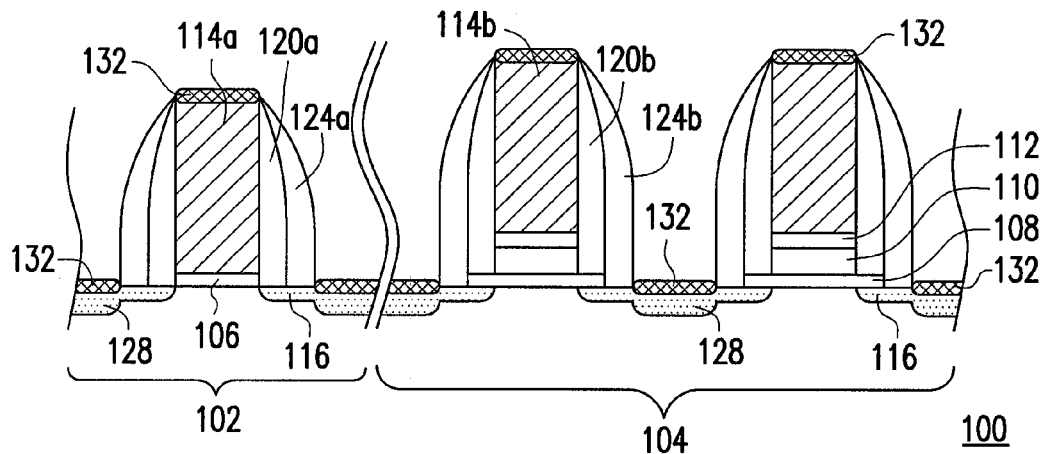

FIGS. 1A-1D illustrate, in a cross-sectional view, a method for fabricating a semiconductor device according to a first embodiment of this invention, wherein FIG. 1D also illustrates the semiconductor device according to the first embodiment.

Referring to FIG. 1A, a semiconductor substrate 100 is provided, having thereon a logic area 102 and a memory array area 104. In the logic area 102, a gate dielectric layer 106 is formed on the substrate 100. In the memory array area 104, a stacked gate dielectric including a tunnel layer 108, a charge-trapping layer 110 and a top insulator 112 from bottom to top is formed on the substrate 100. A conductive layer for forming gate electrodes is then deposited and patterned to form gate conductors 114a of the logic transistors in the logic area 102 and gate conductors 114b of the memory cell transistors in the memory array area 104.

The substrate 100 may include lightly doped single-crystal or epitaxial silicon. The gate dielectric layer 106 may include $SiO_2$ or SiON. The tunnel layer 108 may include silicon oxide, and may have a thickness of 10-50 angstroms. The charge-trapping layer 110 may include silicon nitride (SiN), and may have a thickness of 20-150 angstroms. The top insulator 112 may include silicon oxide, and may have a thickness of 10-50 angstroms. The gate conductors 114a and 114b may include doped poly-Si. When the tunnel layer 108 includes silicon oxide, the charge-trapping layer 110 includes SiN, the top insulator 112 includes silicon oxide and the gate conductor 114b includes doped poly-Si, the semiconductor substrate 100, the tunnel layer 108, the charge-trapping layer 110, the top insulator 112 and a gate conductor 114b together constitute a semiconductor-oxide-nitride-oxide-silicon (SONOS) structure of a memory cell.

Referring to FIG. 1B, the exposed portion of the gate dielectric layer 106 in the logic area 102 and the exposed portion of the top insulator 112 in the memory array area 104 are removed with the gate conductor 114a and 114b as a mask, possibly through a cleaning process that usually uses $HF_{(aq)}$. The exposed portion of the charge-trapping layer 110 in the memory array area 104 is then selectively removed with a wet clean step with $HF/H_2SO_4$, so that the sidewall of the remaining charge-trapping layer 110 is aligned with that of the gate conductor 114b. S/D extension regions 116 are then formed in the substrate 100 in the logic area 102 and the memory array area 104, possibly through an ion implantation process, with the gate conductors 114a and 114b as a mask.

It is noted that a re-oxidation process may be performed to the gate conductors 114a and 114b after the exposed portion of the charge-trapping layer 110 is removed but before the S/D extension regions 116 are formed, mainly for repairing the damages on the gate conductors 114a and 114b. If such a re-oxidation process is performed, a thin $SiO_2$ film will be formed on the sidewall and the top of each of the gate conductors 114a and 114b.

Referring to FIG. 1C, a first spacer 120a and a first spacer 120b are respectively formed on the sidewalls of the gate conductors 114a and 114b in the logic area 102 and the memory array area 104, and the portion of the tunnel layer 108 exposed by the first spacer 120b in the memory array area 104 is removed. The first spacers 120a and 120b may include silicon oxide or SiN, and may each have a width of 50-200 angstroms. The first spacers 120a and 120b may be formed by depositing a substantially conformal layer of its material and anisotropically etching the same, and the portion of the tunnel layer 108 exposed by the first spacer 120b in the memory array area 104 may be removed by continuing the anisotropic etching.

Referring to FIG. 1D, a second spacer 124a and a second spacer 124b are formed on the sidewall of the first spacer 120a in the logic area 102 and the sidewall of the first spacer 120b in the memory array area 104, respectively, possibly in a similar way of forming the first spacers 120a and 120b. The second spacers 124a and 124b may include SiN or $SiO_2$, and may each have a width of 50-750 angstroms.

Thereafter, S/D regions 128 are formed in the substrate 100 outside of the sidewall of each of the second spacers 124a and 124b in the logic area 102 and the memory array area 104, respectively. A metal silicide layer 132 is then formed on all the S/D regions 128 and the gate conductors 114a and 114b, possibly through a salicide (self-aligned silicide) process that typically includes depositing a refractory metal layer, reacting the metal with silicon and then removing the unreacted metal.

In the above first embodiment, because the portion of the charge-trapping layer 110 exposed by the gate conductors 114b and the portion of the tunnel layer 108 exposed by the first spacer 120b are removed in the memory array area 104, the metal salicide layer 132 can be formed on the S/D regions 128 in the memory array area 104 to reduce the electrical resistance of the memory cells.

Besides, although two spacers 120a/b and 124a/b are formed on the sidewall of each gate conductor 114a/b in the above embodiment with the first spacer 120b defining the bounds of the tunnel layer 108 in the memory array area 104 and the second spacer 124a/b defining the bounds of the S/D regions 128, there may alternatively be only one spacer on the sidewall of each gate conductor defining the bound of the tunnel layer 108 in the memory array area 104 and also defining the bounds of the S/D regions 128 in other embodiments, such as the following second embodiment of this invention.

Figure 2A:
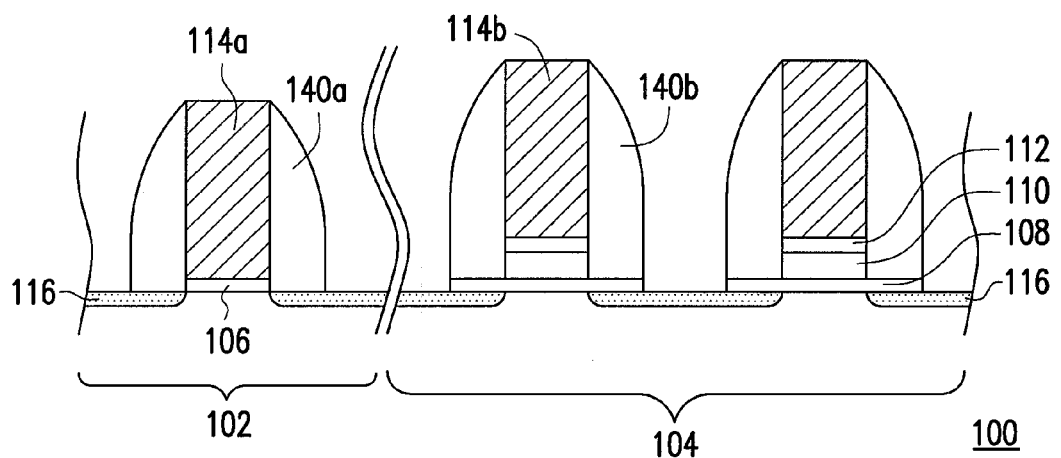
FIGS. 2A and 2B illustrate, in a cross-sectional view, a latter half of a method for fabricating a semiconductor device according to a second embodiment of this invention, wherein the former half of the method is illustrated in FIGS. 1A and 1B, and FIG. 2B also illustrates the semiconductor device according to the second embodiment.
Figure 2B:
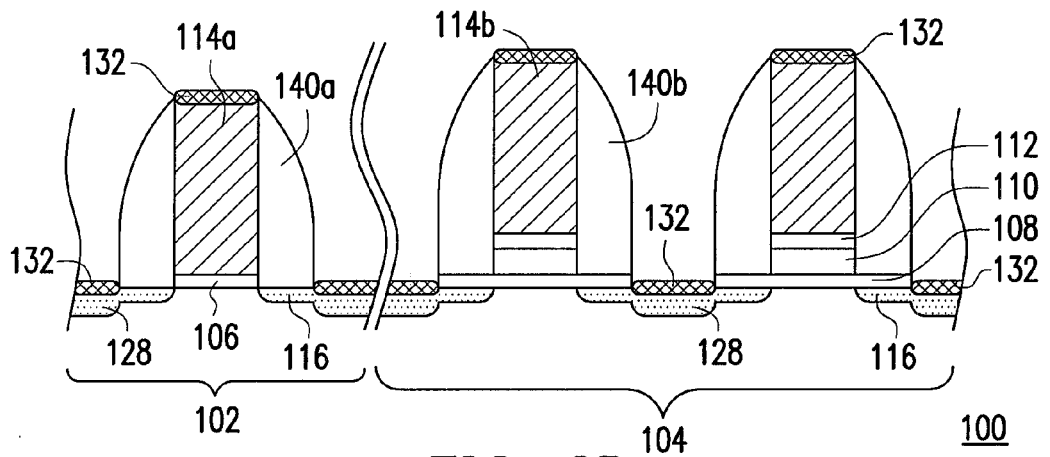

FIGS. 2A and 2B illustrate, in a cross-sectional view, a latter half of a method for fabricating a semiconductor device according to the $2^{nd}$ embodiment of this invention, wherein the former half of the method is illustrated in FIGS. 1A and 1B, and FIG. 2B also illustrates the semiconductor device according to the second embodiment.

Referring to FIG. 2A, after the structure as illustrated in FIG. 1B is obtained, a spacer 140a and a spacer 140b are respectively formed on the sidewalls of the gate conductors 114a and 114b in the logic area 102 and the memory array area 104, and the portion of the tunnel layer 108 exposed by the spacer 140b in the memory array area 104 is removed. The spacers 140a and 140b may include silicon oxide or SiN, and may each have a width of 50-750 angstroms. It is possible to form the spacers 140a and 140b and remove the portion of the tunnel layer 108 exposed by the spacer 140b in a similar way as in the aforementioned process of forming the spacers 120a and 120b and removing the exposed tunnel layer 108.

Referring to FIG. 2B, S/D regions 128 are then formed in the substrate 100 outside of the sidewall of each of the spacers 140a and 140b in the logic area 102 and the memory array area 104, respectively. A metal silicide layer 132 is then formed on all the S/D regions 128 and the gate conductors 114a and 114b, possibly in the same way as mentioned above.

In the above second embodiment, because the portion of the charge-trapping layer 110 exposed by the gate conductors 114b and the portion of the tunnel layer 108 exposed by the spacer 140b are removed in the memory array area 104, the metal salicide layer 132 can be formed on the S/D regions 128 in the memory array area 104 to reduce the electrical resistance of the memory cells.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a semiconductor device, comprising:

forming, over a substrate, a stacked gate dielectric that comprises, from bottom to top, a first dielectric layer, a second dielectric layer and a third dielectric layer;

forming a conductive layer on the stacked gate dielectric;

patterning the conductive layer to form a gate conductor;

removing an exposed portion of the third dielectric layer with the gate conductor as a mask;

removing an exposed portion of the second dielectric layer;

forming S/D extension regions in the substrate with the gate conductor as a mask;

forming a first spacer on a sidewall of the gate conductor and removing a portion of the first dielectric layer exposed by the first spacer;

forming S/D regions in the substrate at both sides of the first spacer; and forming a metal silicide layer at least on the S/D regions.

2. The method of claim 1, further comprising, after the first spacer is formed but before the S/D regions are formed, forming a second spacer on a sidewall of the first spacer, wherein the S/D regions are formed in the substrate outside of a sidewall of the second spacer.

3. The method of claim 1, wherein the S/D regions are formed in the substrate outside of a sidewall of the first spacer.

4. The method of claim 1, wherein removing the exposed portion of the third dielectric layer comprises a cleaning process.

5. The method of claim 1, wherein removing the exposed portion of the second dielectric layer comprises a cleaning process.

6. The method of claim 1, wherein forming the metal silicide layer comprises a self-aligned silicide (salicide) process.

7. The method of claim 6, wherein the conductive layer comprises doped polysilicon, and the metal silicide layer is also formed on the gate conductor.

8. The method of claim 6, further comprising, after the exposed portion of the second dielectric layer is removed but before the S/D extension regions are formed, performing a re-oxidation process to the gate conductor.

9. The method of claim 1, wherein the second dielectric layer comprises a charge-trapping layer.

10. The method of claim 9, wherein the charge-trapping layer comprises silicon nitride.

11. The method of claim 10, wherein the semiconductor comprises a memory cell, the conductive layer comprises dopes polysilicon, the first and the third dielectric layers comprise silicon oxide, and the substrate, the first dielectric layer, the second dielectric layer, the third dielectric layer and the gate conductor constitute a semiconductor-oxide-nitride-oxide-semiconductor (SONOS) structure of the memory cell.

* * * * *